US 8,425,686 B2

(12) United States Patent
Matsumoto (10) Patent No.: US 8,425,686 B2
(45) Date of Patent: Apr. 23, 2013

(54) LIQUID PROCESSING APPARATUS, LIQUID PROCESSING METHOD, AND RECORDING MEDIUM HAVING PROGRAM STORED THEREIN

(75) Inventor: Kazuhisa Matsumoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 266 days.

(21) Appl. No.: 12/843,948

(22) Filed: Jul. 27, 2010

(65) Prior Publication Data

US 2011/0023912 A1 Feb. 3, 2011

(30) Foreign Application Priority Data

Jul. 31, 2009 (JP) .................................. 2009-179428
Jun. 3, 2010 (JP) .................................. 2010-127914

(51) Int. Cl.
*B08B 7/04* (2006.01)
*B08B 9/20* (2006.01)

(52) U.S. Cl.
USPC ............. 134/18; 134/25.1; 134/88; 134/56 R; 134/57 R; 134/60; 239/310; 239/312; 239/314; 239/316

(58) Field of Classification Search ................. 134/25.1, 134/60, 88, 18, 56 R, 57 R; 239/310, 312, 239/314, 316
See application file for complete search history.

(56) References Cited

U.S. PATENT DOCUMENTS

| 4,242,841 | A  | * | 1/1981 | Ushakov et al. | ............... | 451/446 |
| 6,168,048 | B1 | * | 1/2001 | Xu et al. | ............................. | 222/1 |
| 6,579,446 | B1 | * | 6/2003 | Teran et al. | ...................... | 210/85 |
| 6,783,429 | B2 | * | 8/2004 | Nicholes et al. | ................... | 451/6 |
| 2009/0159105 | A1 | * | 6/2009 | Keigo | .......................... | 134/57 R |

FOREIGN PATENT DOCUMENTS

| JP | 6-204201 A | | 7/1994 |
| JP | 2005175183 A | * | 6/2005 |
| JP | 2007123393 A | * | 5/2007 |

* cited by examiner

*Primary Examiner* — Michael Kornakov
*Assistant Examiner* — Katelyn Whatley
(74) *Attorney, Agent, or Firm* — Abelman, Frayne & Schwab (57) ABSTRACT

A liquid processing apparatus is provided which can reduce the amount of liquids used and reduce the difference of the process level between objects to-be-processed. The liquid processing apparatus includes a main pipe, a liquid supply device, a main valve, a plurality of branch pipes, and a plurality of processing units. The liquid supply device includes a mixer, a first liquid supply pipe, and a second liquid source supplying a second liquid and supplies a mixed liquid prepared by mixing the first and second liquids in the mixer to one end of the main pipe. The main valve is configured to close the other end of the main pipe opposite to the liquid supply device when the object to-be-processed is processed in the processing unit.

6 Claims, 3 Drawing Sheets

LIQUID PROCESSING APPARATUS, LIQUID PROCESSING METHOD, AND RECORDING MEDIUM HAVING PROGRAM STORED THEREIN

This application is based on and claims priority from Japanese Patent Application No. 2009-179428 filed on Jul. 31, 2009 and No. 2010-127914 filed on Jun. 3, 2010 with the Japanese Patent Office, the disclosure of which is incorporated herein in its entirety by reference.

TECHNICAL FIELD

The present disclosure relates to a liquid processing apparatus and a liquid processing method for processing an object to-be-processed by means of liquids. The present disclosure also relates to a recording medium having a program performing the liquid processing method for processing the object to-be-processed by means of liquids.

BACKGROUND

There has been conventionally known a process for an object to-be-processed, for example, a cleaning process for a semiconductor wafer (hereinafter, called "wafer") or a glass substrate, using a mixed liquid prepared by mixing a plurality of different liquids. Generally, a liquid processing apparatus for processing an object to-be-processed, such as a wafer or a glass substrate, is provided with a plurality of processing units that forms a processing chamber so that the objects to-be-processed are sequentially processed in each processing unit. See, for example, Japanese Patent Laid-open Publication No. HEI 6-204201.

In the liquid processing apparatus disclosed in Japanese Patent Application Laid Open No. HEI 6-204201, liquid supply devices supplying a mixed liquid prepared by mixing different liquids are allocated to each corresponding processing unit. As a result, the liquid processing apparatus is configured to supply liquid from corresponding liquid supply device to the corresponding processing unit, according to the consumed amount of liquid in each processing unit. However, the concentrations of mixed liquids supplied from the plurality of liquid supply devices are different each other and the processing levels of objects to-be-processed processed in each different processing unit varies. Also, the configuration and control of the liquid processing apparatus tend to be complicated.

Also, in a liquid processing of objects to-be-processed by means of liquid, especially a chemical liquid, it is a big issue to save liquids from the viewpoints of reducing the process cost and the environmental maintenance.

SUMMARY

According to one embodiment, a liquid processing apparatus is provided, the liquid processing apparatus includes a main pipe; a liquid supply device which includes a mixer provided on the main pipe, a first liquid supply pipe supplying a first liquid to the mixer, and a second liquid source supplying a second liquid to the mixer and supplies a mixed liquid prepared by mixing the first and second liquids in the mixer to one end of the main pipe; a main valve provided on the main pipe and configured to close the other end of the main pipe opposite to the liquid supply device; a plurality of branch pipes branching from the main pipe between the liquid supply device and the main valve; and a plurality of processing units provided to correspond to each of the plurality of branch pipes and each configured to process an object to-be-processed by means of the mixed liquid supplied from the corresponding branch pipe, wherein the main valve is configured to close the other end of the main pipe opposite to the liquid supply device when the object to-be-processed is processed in one of the plurality of processing units.

The forgoing summary is illustrative only and is not intended to be in any way limiting. In addition to illustrative aspects, embodiments and features described above, further aspects, embodiments and features will become apparent by reference to the drawings and the following detailed description.

DETAILED DESCRIPTION

In the following detail description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

According to one aspect of the present disclosure, a liquid processing apparatus comprises a main pipe; a liquid supply device which includes a mixer provided on the main pipe, a first liquid supply pipe supplying a first liquid to the mixer, and a second liquid source supplying a second liquid to the mixer and supplies a mixed liquid prepared by mixing the first and second liquids in the mixer to one end of the main pipe; a main valve provided on the main pipe and configured to close the other end of the main pipe opposite to the liquid supply device; a plurality of branch pipes branching from the main pipe between the liquid supply device and the main valve; and a plurality of processing units provided to correspond to each of the plurality of branch pipes and each configured to process an object to-be-processed by means of the mixed liquid supplied from a corresponding branch pipe. In particular, the main valve is configured to close the other end of the main pipe opposite to the liquid supply device when the object to-be-processed is processed in one of the plurality of processing units.

The liquid supply device is configured to supply the mixed liquid prepared by mixing the first and second liquids to one end of the main pipe of which the other end is closed by the main valve in such a pressure that the mixed liquid can be supplied to all of the plurality of processing units at the same time.

The first liquid supply pipe is configured to supply the first liquid to the main pipe in such a pressure that the first liquid can be supplied to all of the plurality of processing units at the same time, and the second liquid is supplied from the second liquid source to the main pipe based on the number of the processing units which is processing the object to-be-processed.

Also, the main pipe and the branch pipe are filled with the mixed liquid before processing of the object to-be-processed in the processing unit begins.

According to another aspect of the present disclosure, a liquid processing method includes charging a main pipe from one end with a mixed liquid prepared by mixing a first liquid supplied from a first liquid supply pipe and a second liquid supplied from a second liquid source, where a plurality of branch pipes connected to a plurality of processing units are stretched inside the main pipe, processing an object to-be-processed in each of the plurality of processing units using the mixed liquid provided from the main pipe to each of the plurality of processing units through a corresponding branch pipe; and closing another end of the main pipe by a main valve while processing is performed in each of the plurality of processing units using the mixed liquid supplied from the main pipe.

The liquid processing method further includes supplying the mixed liquid prepared by mixing the first and second liquids to one end of the main pipe of which the other end is closed by the main valve in such a pressure that can supply the mixed liquid to all of the plurality of the processing units at the same time, while processing is performed in each of the plurality of processing units using the mixed liquid supplied from the main pipe.

In the processing method, the charging step further includes supplying the mixed liquid to one end of the main pipe when the main valve is closed and at least one of a plurality of valves provided in each of the plurality of branch pipes is opened; and closing the main valve and all of the valves for the plurality of branch pipes. In particular, each of the plurality of valves of the plurality of branch pipes is opened at least once during the supplying step.

In the processing method, the charging step further includes supplying the mixed liquid to one end of the main pipe when all of the plurality of valves provide for each of the plurality of branch pipes is closed; supplying the mixed liquid to one end of the main pipe when the main valve is closed, and at least one of the plurality of valves for the plurality of branch pipes is opened; and closing the main valve and all of the valves for the plurality of branch pipes. In particular, each of the plurality of valves of the plurality of branch pipes is opened at least once during the supplying step.

In the processing method, while processing is performed in each of the processing units using the mixed liquid supplied from the main pipe, the first liquid supply pipe supplies the first liquid to the main pipe in such a pressure that the first liquid can be supplied to all of the plurality of processing units at the same time, and the second liquid is supplied to the main pipe in an amount based on the number of the processing units which is processing the object to-be-processed.

In the processing method, the plurality of branch pipes are also charged with the mixed liquid when the main pipe is charged with the mixed liquid.

According to yet another aspect of the present disclosure, a computer-readable recording medium storing a computer executable program that, when executed, causes a computer to perform the liquid processing method as described above in a liquid processing apparatus.

According to yet another aspect of the present disclosure, the mixed liquid supplied from a single liquid supply device to the main pipe is used for the processing of the object to-be-processed in the plurality of processing units. Therefore, it is possible to reduce the process difference between the objects to-be-processed processed in the different processing units. Also, the necessary amount of the mixed liquid is supplied from the liquid supply device to the main pipe from the liquid supply device according to the operation condition of each processing unit thereby saving the overall chemical liquid.

Hereinafter, one exemplary embodiment as a non-limiting example of the present disclosure will be described with reference to the attached drawings. For an easier illustration and understanding, the actual items are modified and exaggerated appropriately in the attached drawings using the scale and size ratio of length and breadth. In all of the attached drawings, the same or corresponding members (or components) are designated with the same or corresponding reference numerals to omit repetitive descriptions.

In the below exemplary embodiments, the present disclosure is applied to a cleaning process of a semiconductor wafer (as an example of an object to-be-processed), especially a process using a chemical liquid is described. However, it is obvious that the present disclosure is not limited to the application to the cleaning process of wafer.

Figure 1:
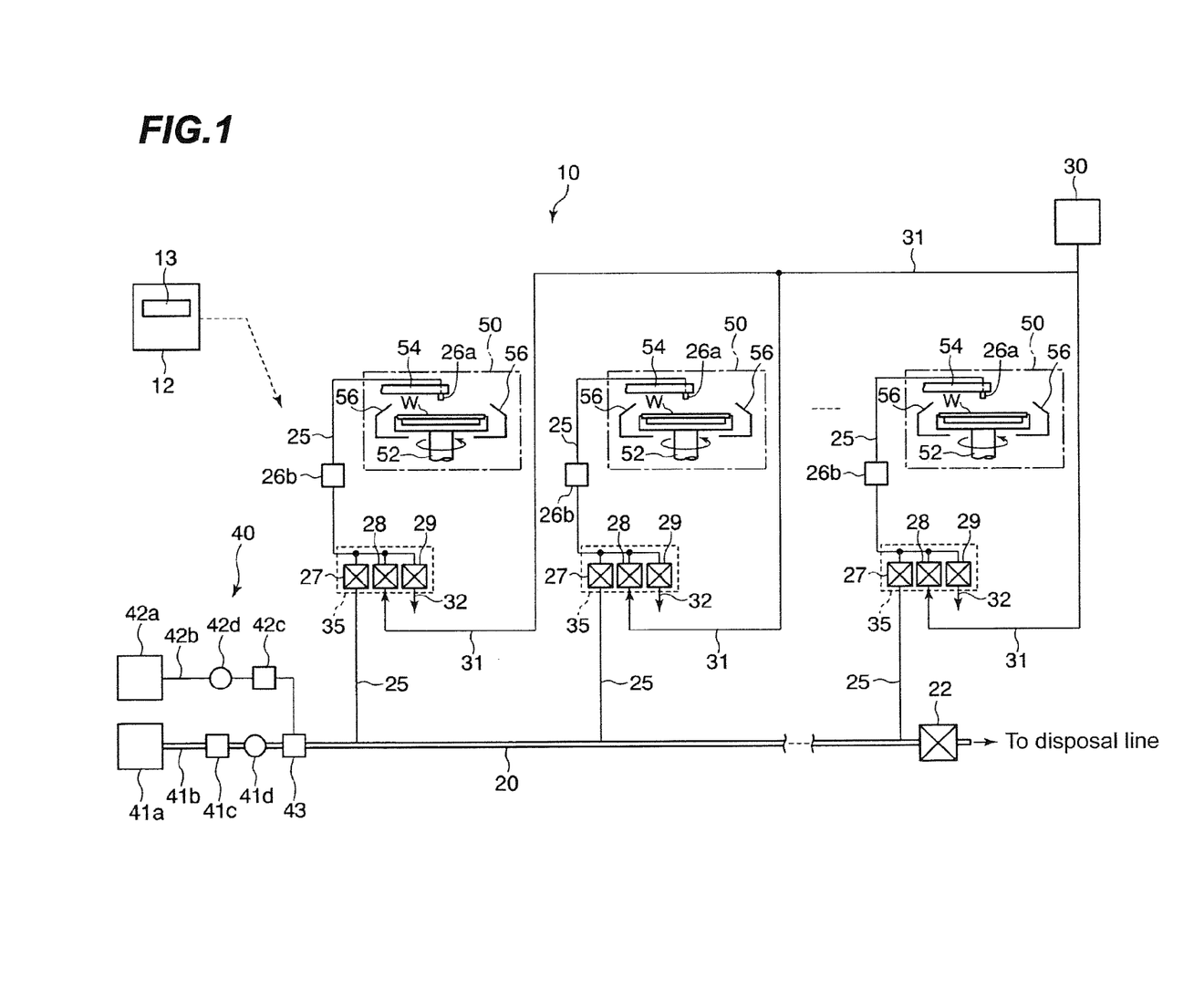
FIG. 1 is a schematic view illustrating the entire configuration of a liquid processing apparatus according to an embodiment of the present disclosure.

As shown in FIG. 1, a liquid processing apparatus 10 comprises a main pipe 20, a liquid supply device 40 connected to one end of main pipe 20 supplying a mixed liquid to main pipe 20, a main valve 22 provided on main pipe 20, and a plurality of branch pipes 25 branching from main pipe 20. A processing unit 50 is provided for each of the plurality of branch pipes 25. Each branch pipe 25 is provided with a valve 27 opening and closing branch pipe 25. Also, liquid processing apparatus 10 comprises a controller 12 controlling the operation of each component of the liquid processing apparatus 10. In the below, each component of liquid processing apparatus 10 is described sequentially.

First, liquid supply device 40 is described. Liquid supply device 40 supplies a mixed liquid used for processing wafers (an object to-be-processed W) to each of the plurality of processing units 50 via main pipe 20 and branch pipes 25. In the present embodiment, liquid supply device 40 is configured to supply a chemical liquid used for the chemical liquid processing of wafers W into main pipe 20.

As shown in FIG. 1, in the present embodiment, liquid supply device 40 includes a mixer 43 provided at one end of main pipe 20, first liquid supply pipe 41b supplying a first liquid, and a second liquid source 42a supplying a second liquid which is different from the first liquid. First liquid supply pipe 41b is extended between mixer 43 and a first liquid source 41a. A second liquid supply pipe 42b is provided between second liquid source 42a and mixer 43, and the second liquid is supplied to mixer 43 from second liquid source 42a via second liquid supply pipe 42b. Mixer 43 is a member where first liquid supply pipe 41b and second liquid supply pipe 42b are mixed together. The first liquid from first liquid source 41a and the second liquid from second liquid source 42a are joined and mixed together at mixer 43 so that the mixed liquid can be acquired. Mixer 43 may include a member configured to have a function of actively mixing the first liquid and the second liquid. However, mixer 43 may not be limited to this, and mixer 43 may be a member such as T-shaped joint configured to mix the first liquid and the second liquid only by means of each flow of the first liquid and the second liquid before the joining.

In the present embodiment, water, especially deionized water, is supplied from first liquid source 41a as the first liquid and a high-concentration chemical liquid is supplied from second liquid source 42a as the second liquid. Liquid supply device 40 is configured to mix the water from first liquid supply pipe 41b and the high-concentration chemical liquid from second liquid source 42a in order to supply the mixed liquid into main pipe 20 as the chemical liquid adjusted to a desired concentration. Various chemical liquids useful for cleaning process of wafers W may be adopted as the high-concentration chemical liquid (the second liquid) supplied from second liquid source 42a. For example, it is possible that diluted hydrofluoric acid, Ammonia hydrogen peroxide mixture (SC1), or hydrochloric acid peroxide mixture (SC2) may be supplied from second liquid source 42a. Also, first liquid source 41a may be a water source of a plant provided at the place where liquid processing apparatus 10 is provided.

Liquid supply device 40 is configured to supply the mixed liquid of which the mixing ratio is adjusted into main pipe 20 in such a pressure that the mixed liquid can be supplied to all of the plurality of processing units 50 connected to main pipe 20 at the same time. In the embodiment shown in the drawings, a constant pressure valve 41c is provided on first liquid supply pipe 41b of liquid supply device 40. Through such a configuration, the first liquid can be supplied to main pipe 20 via first liquid supply pipe 41b from first liquid source 41a in the pressure that the first liquid can be supplied to all of the plurality of processing units 50 connected to main pipe 20 at the same time. Meanwhile, a flow control valve 42c and a flow meter 42d are provided on second liquid supply pipe 42b. The second liquid from second liquid source 42a is supplied to main pipe 20 via mixer 43 in the amount based on the number of processing units 50 which is processing wafer W. As an example, flow control valve 42c may be configured to adjust the amount of the second liquid based on the number of processing units 50, which is processing wafer W by consuming the liquid in main pipe 2, among processing units 50 connected to main pipe 20, and to supply the adjusted amount of the second liquid to main pipe 20. Through such a configuration, liquid supply device 40 may maintain the internal pressure of main pipe 20 as a predetermined level by the mixed liquid having a predetermined concentration. Also, the mixed liquid having a predetermined concentration is supplied from liquid supply device 40 to the main pipe based on the necessary amount determined according to the operation conditions of processing units 50.

The present embodiment is not limited to that described above. For example, the flow rate of the second liquid supplied to main pipe 20 via second liquid supply pipe 42b may be controlled according to the flow rate of the first liquid supplied to main pipe 20 via first liquid supply pipe 41b, i.e., based on the measuring result at a flow meter 41d provided on first liquid supply pipe 41b. In the case, it is possible to make the second liquid to be supplied to main pipe 20 in the such a pressure that the mixed liquid can be supplied to all of the plurality of processing units 50 connected to main pipe 20 at the same time, so that the amount of the first and second liquids supplied to main pipe 20 is in a constant proportion.

Next, main pipe 20 and main valve 22 are described. As described above, the one end of main pipe 20 is connected to liquid supply device 40. The other end of main pipe 20, which is the opposite to the one end connected to liquid supply device 40, is connected to a disposal line. Main valve 22 is provided at the other end opposite to liquid supply device 40 of main pipe 20. Main valve 22 is constituted with a valve capable of opening/closing by the operation of the liquid pressure such as an air operating valve that performs opening/closing operation by the air pressure. Also, the opening and closing operation of main valve 22 is controlled by controller 12. Consequently, main valve 22 selectively maintains one of the states in which main pipe 20 is closed to the disposal line, and main pipe 20 is connected to the disposal line, based on the control signal from controller 12.

Next, branch pipe 25, valve for branch pipe 27, and processing unit 50 are described. As shown in FIG. 1, the plurality of branch pipes 25 extends from main pipe 20 between liquid supply device 40 and main valve 22. As shown in FIG. 1, each branch pipe 25 extends into corresponding processing unit 50 at one end opposite to the other end connected to main pipe 20. Each branch pipe 25 has a discharge opening 26a discharging liquids at an opposite end to the end connected to main pipe 20, and discharge opening 26a is supported by a supporting member 54 in processing unit 50. Also, a regulator 26b for regulating the flow rate is provided on branch pipe 25 and the flow rate of the liquid discharged from discharge opening 26a is regulated by regulator 26b.

Valve for branch pipe 27, like main valve 22 described above, includes a valve capable of opening and closing the operation by the fluid pressure, for example, an air-operated valve capable of opening and closing the operation by the air pressure. Also, the opening and closing operation of valve for branch pipe 27 is controlled by controller 12. Valve for branch pipe 27 is constituted as one of multi-type valves 35 provided on branch pipe 25 and multi-type valves 35 include valves for rinsing liquid 28 and disposal liquid 29 described below.

Processing unit 50 includes a holding device 52 holding wafer W and partition walls (not shown) partitioning the processing chambers that processes wafers W. Holding device 52 holds wafer W in such a way that the surface of wafer W is approximately at the horizontal direction. Holding device 52 is configured to rotate wafer W on the axis of the center of wafer W having a disc shape. Branch pipe 25 extends into the inside of the partition wall, and discharge opening 26a of branch pipe 25 is disposed in the processing chamber.

Supporting member 25 is configured to be movable, for example, to be shakable, relatively to wafer W. When supporting member 54 moves, discharge opening 26a of branch pipe 25 is moves between a processing position where discharge opening 26a faces approximately the center of wafer W held on holding device 52 above wafer W and a stand-by position where discharge opening 26a is positioned out of the area above wafer W in a transverse direction. If discharge opening 26a is in the processing position, the liquid discharged from discharge opening 26a is supplied to wafer W and wafer W is processed by the supplied liquid. In contrast, if discharge opening 26a is in the stand-by position, the liquid discharged from discharge opening 26a is not supplied to wafer W but, for example, discarded.

Also, as shown in FIG. 1, processing unit 50 further includes a cup 56 collecting the liquid discharged to wafer W from discharge opening 26a. Cup 56 is provided in the processing chamber and prevents the liquid discharged from discharge opening 26a from dispersing in the processing chamber.

Meanwhile, as described above, liquid supply device 40 of the present embodiment is configured to supply the concentration-adjusted chemical liquid as the mixed liquid to wafer W in processing unit 50 via main pipe 20 and branch pipe 25. Also, in the present embodiment, liquid processing apparatus 10 is configured to supply other liquids to the wafer W, for example, a rinsing liquid, which is necessary for the cleaning process of wafer W.

In the detailed configuration, as shown in FIG. 1, a valve for rinsing liquid 28 is provided on branch pipe 25 so as to be parallel to valve for branch pipe 27. A rinsing liquid supply pipe 31 connected to a rinsing liquid source 30 is connected to valve for rinsing liquid 28. That is, in the embodiment illustrated in the drawings, a part of downstream side of branch pipe 25 of liquid processing apparatus 10 also functions as a supply pipe for the rinsing liquid.

Also, a valve for disposal liquid 29 is provided so as to be parallel to valve for branch pipe 27 and valve for rinsing liquid 28. Valve for disposal liquid 29 is connected to a disposal pipe 32. For example, the liquid in the more downstream part than valve for branch pipe 27 of branch pipe 25 may be disposed of by opening and closing valve for disposal liquid 29.

Next, controller 12 is described. A keyboard performing input operation of commands for managing liquid processing apparatus 10 by a process manager or an input/output device including a display visibly displaying operation conditions of liquid processing apparatus 10 is connected to controller 12. Also, controller 12 can access a recording medium 13 having a program for executing the process performed in liquid processing apparatus 10. Recording medium 13 may include a well-known program recording medium such as a ROM and a RAM, a hard disk, a CD-ROM, a DVD-ROM, and a disk-shaped recording medium such as a flexible disk.

Figure 2:
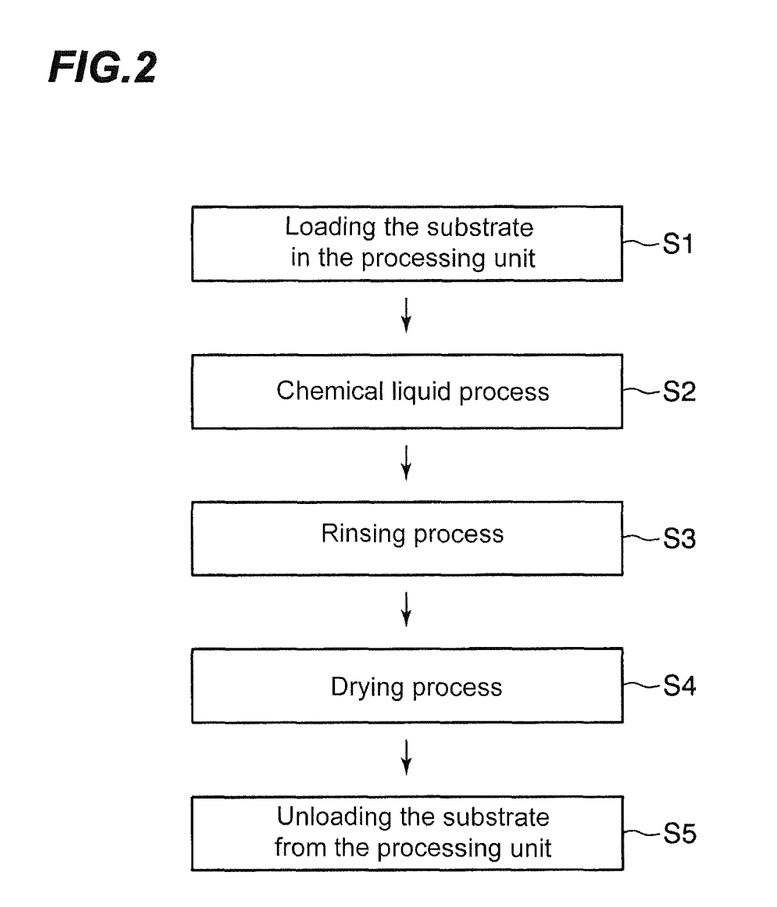
FIG. 2 is a flow chart illustrating one example of a liquid processing method for an object to-be-processed which can be performed by the liquid processing apparatus as shown in FIG. 1.

Next, one embodiment of a liquid processing method, which may be performed by liquid processing apparatus 10 comprising foregoing configuration, is described. In the liquid processing method described below, as shown in FIG. 2, wafer W as an object to-be-processed is cleaned in a processing unit 50. Also, in chemical liquid processing step S2 among the chemical liquid processing steps shown in FIG. 2, wafer W is processed by the mixed liquid supplied from liquid supply device 40 of liquid processing apparatus 10. In the below, first, referring to the flow chart shown in FIG. 2, the liquid processing method performed to wafer W in processing unit 50 is described, and then, the operation of liquid processing apparatus 10 performing chemical liquid processing step S2 is described.

The operation of each component for performing the liquid processing method describe below is controlled by the control signal from controller 12 according to the program stored in advance in program recording medium 13.

As shown in FIG. 2, first, wafer W to be cleaned is loaded in each processing unit 50 of liquid processing apparatus 10 and held by holding device 52 in each processing unit 50 (step S1 in FIG. 2).

Next, the mixed liquid of the water (the first liquid) from first liquid supply pipe 41*b* and the high-concentration chemical liquid (the second liquid) from second liquid source 42*a* is supplied into processing unit 50 from liquid supply device 40. Then, the mixed liquid is discharged towards wafer W loaded in each processing unit 50, and the wafer processing is performed (step S2). In the cleaning process of wafer W, the concentration-adjusted chemical liquid, for example, diluted hydrofluoric acid, ammonia hydrogen peroxide mixture (SC1), and hydrochloric acid peroxide mixture (SC2), is supplied from the liquid supply device 40 as a mixed liquid.

When the wafer process is completed using the mixed liquid (chemical liquid), then, the rinsing process is performed for the wafer W using the water, especially the deionized water, as a rinsing liquid (step S3). Specifically, the rinsing liquid is supplied into processing unit 50 via rinsing liquid supply pipe 31 and valve for rinsing liquid 28. Then, in each processing unit 50, the rinsing liquid is discharged to wafer W on which the mixed liquid remains and the mixed liquid remaining on wafer W is replaced by the rinsing liquid.

When the rinsing process is completed, the drying process of wafer W is performed by rotating wafer W at a high speed by holding device 52 (step S4). In this way, the cleaning process of wafer W in processing unit 50 is completed, and wafer W is unloaded from processing unit 50 (step 5).

Next, the operation of liquid processing apparatus 10 performing the chemical liquid process is described.

First, prior to the chemical liquid processing step S2 using the mixed liquid (chemical liquid) to process wafer W, main pipe 20 is charged with the mixed liquid. The charging step begins before step S1 that loads wafer W into each processing unit 50. Also, the charging step and step S1 may be performed at the same time.

In a specific charging method of the mixed liquid, the mixed liquid is supplied to main pipe 20 first from one end of main pipe 20 by liquid supply device 40 while main valve 22 is closed and at least one of the plurality of the valves for branch pipe (27) is opened. The mixed liquid in main pipe 20 of which the other end is closed by main valve 22 flows into branch pipe 25 of which corresponding valve for branch pipe 27 is opened. At this time, support member 54 of each processing unit 50 is moved so that discharge opening 26*a* of branch pipe 25 is disposed in the stand-by position. Thus, the mixed liquid introduced into branch pipe 25 from main pipe 20 is discharged from discharge opening 26*a* positioned in the stand-by position. In this state, corresponding valve for branch pipe 27 is closed thereby charging main pipe 20, branch pipe 25, and even discharge opening 26*a* of branch pipe 25 with the mixed liquid.

All of valves for branch pipe 27 are opened at least once so as to charge all of the branch pipes with the mixed liquid during at least one period when the mixed liquid is supplied to main pipe 20. At this time, it is possible that all of valves for branch pipe 27 are opened at the same time or at least two valves for branch pipe 27 are opened at a different time in sequence or valves for branch pipe 27 are opened one by one at a different time in sequence. Also, the state described above that [main valve 22 is closed and at least one of the plurality of valves for branch pipe 27 is opened in this step] indicates that, during this step, not only that at least one of valves for branch pipe 27 is always opened but also that the time lug occurs when valve for branch pipe 27 opened is switched, i.e. all of valves for branch pipe 27 may be closed.

In these steps, the water from first liquid source 41*a* of liquid supply device 40 and the high-concentration chemical liquid from second liquid source 42*a* of liquid supply device 40 are supplied to mixer 43. Thus, the water and the high-concentration chemical liquid are mixed to be a mixed chemical liquid in mixer 43 provided on main pipe 20, and the mixed chemical liquid is supplied to main pipe 20 from one end of main pipe 20. At this time, the water is supplied to main pipe 20 in a predetermined pressure and the high-concentration chemical liquid is supplied to main pipe 20 in the amount based on the number of processing units in which the mixed liquid is discharged by opening corresponding valve for branch pipe 27. Therefore, the concentration of the chemical liquid supplied to main pipe 20 from liquid supply device 40 is maintained as a predetermined level. Even if the amount of the high-concentration chemical liquid (the second liquid) supplied to mixer 43 is determined, as described above, based on the amount of the water (the first liquid) supplied to main pipe 20 from first liquid supply pipe 41*b*, it is possible that the concentration of the chemical liquid supplied to main pipe 20 from liquid supply device 40 is maintained as a predetermined level.

In this way, when main pipe 20 and all of branch pipes 25 are charged with the mixed liquid, all of valves for branch pipe 27 and main valve 22 are closed. Also, when main valve 22 is closed like this, the supply of the first liquid is stopped. In this way, filling main pipe 20 and branch pipe 25 with the mixed liquid as a preparation step is completed.

The specific embodiment of the method for charging main pipe 20 and branch pipe 25 with the mixed liquid as described, is only the example and can be modified in various ways. As an example, when all of valves for branch pipe 27 is closed and main valve 22 is opened first, the supply of the mixed liquid from the liquid supply device 40 to main pipe 20 may begin, and charge main pipe 20 with the mixed liquid. And next, by the same way described above, both main pipe 20 and branch pipe 25 may be charged with the mixed liquid. In other words, charging the mixed liquid may include supplying the mixed liquid to main pipe 20 from one end of main pipe 20 while all of valves for branch pipe 27 are closed and main valve 22 is opened, then supplying the mixed liquid to main pipe 20 from one end of main pipe 20 while main valve 22 is closed and one of valves for branch pipe 27 is opened, and then closing both main valve 22 and valve for branch pipe 27.

By opening main valve 22 after the mixed liquid begins to be supplied to main pipe 20, it is possible to prevent the mixed liquid from not smoothly flowing into main pipe 20 due to the back pressure. Therefore, the mixed liquid can spread in main pipe 20 quickly and uniformly in a stable manner. And then, the mixed liquid in main pipe 20 is introduced into branch pipe 25 and branch pipe 25 is charged with the mixed liquid.

In this method, the amount of the high-concentration chemical liquid (the second liquid) supplied to mixer 43 may be determined based on the amount of the water (the first liquid) supplied to main pipe 20 from first liquid supply pipe 41b. In this case, it is possible to make the concentration of the chemical liquid (the mixed liquid) supplied to main pipe 20 to be a desired level in the state that all of valve for branch pipe 27 are closed and main valve 22 is opened.

In this way, when main pipe 20 and branch pipe 25 are charged with the mixed liquid, and wafer W is loaded into processing unit 50 as described above, wafer W is processed in processing unit 50 sequentially (step S2 described above).

In step S2, wafer W introduced into processing unit 50 is held and rotated by holding device 52. Also, supporting member 54 is disposed in the processing position where discharge opening 26a faces the upper side of wafer W. In this state, valve for branch pipe 27 is opened and the mixed liquid is introduced into branch pipe 25 from main pipe 20 kept in a sufficient pressure. Also, the mixed liquid is discharged to the upper surface (outside surface) of wafer W via discharge opening 26a of branch pipe 25. The mixed liquid spreads on the surface of rotating wafer W and the surface of wafer W is processed by the mixed liquid.

When wafer W is loaded in processing unit 50 (step S1), wafers W are usually transferred to each of the plurality of processing units 50 in sequence. Therefore, the timings when wafers W are loaded in each processing unit 50 are different from each other and the wafer-processing that uses the mixed liquid in processing unit 50 usually does not begin simultaneously in the plurality of processing units 50 of liquid processing apparatus 10. Valves for branch pipe 27 are opened sequentially from valve for branch pipe 27 corresponding to processing unit 50 ready for the wafer-processing, and the wafer-processing begins sequentially using the mixed liquid in each corresponding processing unit 50.

Meanwhile, when the mixed liquid is supplied to each processing unit 50 from main pipe 20 via branch pipe 25, the pressure in main pipe 20 is decreased. Also, when the process is performed in each processing unit 50 using the mixed liquid supplied from main pipe 20, liquid supply device 40 introduces the concentration-adjusted mixed liquid into main pipe 20 in such a pressure that the mixed liquid can be supplied to all of the plurality of processing units 50 simultaneously, as described above. Therefore, if the mixed liquid charging main pipe 20 is used for the process in processing unit 50, liquid supply device 40 introduces the concentration-adjusted mixed liquid into main pipe 20 and the pressure of the mixed liquid in main pipe 20 remains constant. Thus, the mixed liquid used for the wafer-processing can be supplied to the plurality of processing units 50 in a stable flow rate by using one liquid supply device 40.

Thus, if an appropriate amount of the mixed liquid is supplied to wafer W in processing unit 50, branch pipe 25 corresponding to processing unit 50 is closed by valve for branch pipe 27. In this way, the processes (chemical liquid processes) for wafer W using the mixed liquid in each processing unit 50 is completed in sequence.

After the chemical liquid process (step S2) for wafer W is completed, the rinsing process (step S3) for wafer W is performed as described above. In the rinsing process, the rinsing liquid is introduced into branch pipe 25 via valve for rinsing liquid 28 and discharged from discharge opening 26a of branch pipe 25. Thus, in the beginning of the rinsing process, the mixed liquid remaining in the downstream part of branch pipe 25 is pushed out by water. According to this method, the process for wafer W may be changed without drying the surface of wafer W by supplying the liquid continuously to wafer W from the chemical liquid process (step S2) to the rinsing process (step S3). Thus, the problem, such as watermark, can be avoided.

In this way, after the rinsing process is completed, the rinsing liquid remains in the further downstream part than valve for rinsing liquid 28 [valve for branch pipe 27] of branch pipe 25. And, when the process for next wafer W begins, the rinsing liquid remaining in branch pipe 25 may be disposed of from branch pipe 25 via valve for disposal liquid 29 and disposal pipe 32 before performing or concurrently with the loading step of next wafer W. In this way, the mixed liquid of a constant mixing ratio can be supplied to next wafer W in the chemical liquid process step S2.

After wafer W is unloaded from each processing unit 50 after completing the process, next wafer W to be processed is loaded into each processing unit 50. If the same process is performed to next wafer W as previous wafer W followed by the next wafer in the same processing unit 50, i.e., if it is not necessary to change the mixing ratio (concentration) of the mixed liquid supplied from liquid supply device 40, the mixed liquid may remain in main pipe 20 and branch pipe 25.

Meanwhile, if different processes are performed to next wafer W as previous wafer W followed by the next wafer in the same processing unit 50 so that it is necessary to change the concentration of the mixed liquid used for the wafer processing, main pipe 20 is charged with the mixed liquid to be used for the next wafer, before the beginning of the chemical liquid process for the next wafer W. In this case, only the water (especially, deionized water) from first liquid source 41a is supplied into the main pipe (20) first from liquid supply device 40, and then the chemical liquid remaining in main pipe 20 and branch pipe 25 is substituted with the water. For specific embodiment, main pipe 20 is charged with the water first by opening main valve 22. Next, branch pipe 25 is charged with the water by closing main valve 22 and opening valve for branch pipe 27. At this time, the water is discharged from discharge opening 26a of branch pipe 25 disposed in the stand-by position, and the inside of branch pipe 25 is washed out by the water throughout the length of branch pipe 25. In this way, after the insides of main pipe 20 and branch pipe 25 are washed out by the water, the mixed liquid adjusted to the desired concentration is introduced into main pipe 20 and branch pipe 25 from liquid supply device 40 by performing the same method as described above. After the above preparation step is completed, the process for wafer W using the mixed liquids having different concentrations is performed.

The specific embodiment of the method of substituting different mixed liquids with each other in main pipe 20 and branch pipe 25, as described above, is only one example and can be modified variously. For example, the timing of opening and closing main valve 22 and valve for branch pipe 27 is not limited to the embodiment described above. Therefore, the mixed liquids remaining in main pipe 20 and branch pipe 25 may be substituted with the water at the same time. Also, it is possible to substitute different mixed liquids with each other in main pipe 20 and branch pipe 25 by substituting the mixed liquids remaining in main pipe 20 and branch pipe 25 with the water, and then, charging main pipe 20 and branch pipe 25 with the mixed liquids to be used next. Also, the mixed liquids remaining in main pipe 20 and branch pipe 25 may be substituted directly with the mixed liquids to be used next.

According to the embodiment described above, liquid supply device 40 introduces the mixed liquid prepared by mixing the first liquid and the second liquid at the adjusted mixing ratio into one end of main pipe 20 of which the other end is closed by main valve 22 in such a pressure that the mixed liquid can be supplied to the plurality of processing units 50 at the same time. Therefore, the mixed liquid may be consistently supplied to the plurality of processing units 50 by one liquid supply device 40. Also, when wafer W is processed in processing unit 50, only a necessary amount of mixed liquid is supplied form liquid supply device 40 to main pipe 20 according to the operation condition of each processing unit 50. Therefore, it is possible to reduce the cost for processing the object to-be-processed (wafer W) by avoiding wasting of large amount of mixed liquid to save the mixed liquid. Also, when the chemical liquid is the mixed liquid supplied from liquid supply device 40, it is environmental friendly because it is possible to reduce the disposal amount of the chemical liquid in the chemical liquid process. Also, in different processing units 50 performing the process at the same time, different wafers W can be processed using the same liquid (for example, the same concentration) supplied from main pipe 20. Therefore, the conditions of the processes in each of the wafers may be uniformized.

It is possible to modify the embodiment described above variously. In the below, one example of the modification is described.

Figure 3:
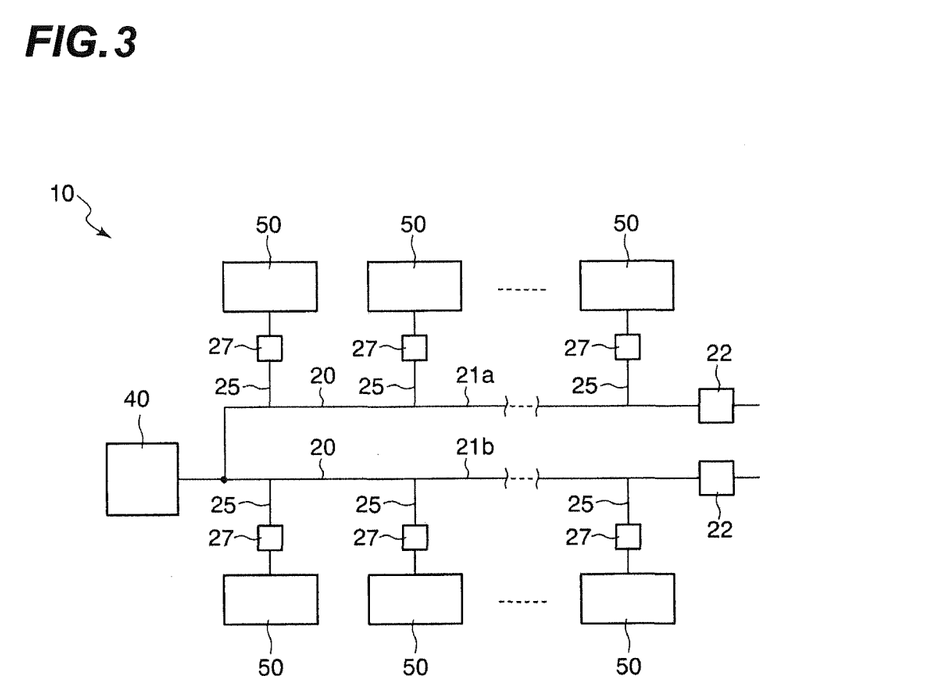
FIG. 3 is a schematic view illustrating a modified embodiment of the liquid processing apparatus.

For example, in the above embodiment, one main pipe 20 is formed in linear shape, but it is not limited to that constitution. For example, as shown in FIG. 3, the end of main pipe 20 opposite to liquid supply device 40 can be divided into the plurality of pipe lines 21a, 21b. In the example shown in FIG. 3, main valve 22 capable of closing the end of main pipe 20 opposite to liquid supply device 40 is provided on each pipe line 21a, 21b. Also, in the area between liquid supply device 40 and each main valve 22, the plurality of branch pipes 25 is extended from each pipe line 21a, 21b. In FIG. 3, valve for rinsing liquid 28, rinsing liquid supply pipe 31, valve for disposal liquid 29 and disposal pipe 32 are omitted for brevity. Also, other components in the embodiment shown in FIG. 3 are the same as those in the embodiment described above, thus repetitive descriptions are omitted.

Also, in the above embodiment, the constitution of liquid supply device 40 is described as a specific example, but it is not limited to that example. As a different constitution from the above, liquid supply device 40 may be configured to supply the mixed liquid prepared by mixing the first liquid and the second liquid to main pipe 20 closed by main valve 22 in such a pressure that the mixed liquid can be supplied to all of the plurality of processing units 50 at the same time.

Also, in the above embodiment, liquid supply device 40 has first liquid supply pipe 41b supplying the water and the second liquid source supplying the high-concentration chemical liquid, but it is not limited to that example. For example, liquid supply device 40 may have more than two chemical liquid sources.

In the above, some modifications of the above embodiment are described, but it is obvious that the appropriate combinations and applications of modifications can be made.

Also, as described at the beginning of the specification, the present disclosure can be applied to the processes other than the cleaning process for the wafer.

From the foregoing, it will be appreciated that various embodiments of the present disclosure have been described herein for purpose of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing method using a liquid processing apparatus including a plurality of processing units, and a liquid supply device configured to supply a processing liquid to the plurality of processing units through a main pipe and a plurality of branch pipes each branched from the main pipe and connected to each of the plurality of processing units, the liquid processing method comprising:
charging the main pipe from one end with a mixed liquid prepared by mixing a first liquid supplied from a first liquid supply pipe and a second liquid supplied from a second liquid source prior to performing a liquid processing for a substrate with the mixed liquid, where each of the plurality of branch pipes connected to a corresponding processing unit at one end is connected to the main pipe at the other end, wherein the charging step comprises:
supplying the mixed liquid to one end of the main pipe while all of the plurality of valves provided for each of the plurality of branch pipes is closed and the main valve is opened;
after the supplying of the mixed liquid to one end of the main pipe, supplying the mixed liquid to one end of the main pipe while the main valve is closed and at least one of the plurality of valves for the plurality of branch pipes is opened; and
wherein each of the plurality of valves of the plurality of branch pipes is opened at least once during the supplying step,
processing the substrate in each of the plurality of processing units using the mixed liquid provided from the main pipe to each of the plurality of processing units through a corresponding branch pipe; and
continuously supplying the mixed liquid to the main pipe while closing the other end of the main pipe with a main valve while the liquid processing is performed for the substrate in each of the plurality of processing units so that the pressure of the mixed liquid at the main pipe is maintained with a substantially constant pressure.

2. A liquid processing method according to claim 1, further comprising supplying the mixed liquid prepared by mixing the first and second liquids to one end of the main pipe of which the other end is closed by the main valve in such a pressure that can supply the mixed liquid to all of the plurality of the processing units at the same time, while the processing is performed in each of the plurality of processing units using the mixed liquid supplied from the main pipe.

3. A liquid processing method according to claim 1, wherein the charging step further comprising:

supplying the mixed liquid to one end of the main pipe in a state where the main valve is closed and at least one of a plurality of valves provided in each of the plurality of branch pipes is opened, wherein each of the plurality of valves of the plurality of branch pipes is opened at least once during the supplying step.

4. A liquid processing method according to claim 1, wherein, while processing is performed in each of the processing units using the mixed liquid supplied from the main pipe, the first liquid supply pipe supplies the first liquid to the main pipe in such a pressure that the first liquid can be supplied to all of the plurality of processing units at the same time, and the second liquid is supplied to the main pipe in an amount based on the number of the processing units which is processing the substrate.

5. A liquid processing method according to claim 1, wherein the plurality of branch pipes are also charged with the mixed liquid when the main pipe is charged with the mixed liquid.

6. A non-transitory computer-readable recording medium storing a computer executable program that, when executed, causes a computer to perform the liquid processing method according to claim 1 in a liquid processing apparatus.

* * * * *